United States Patent [19]
Gardner et al.

[11] Patent Number: 6,051,876
[45] Date of Patent: Apr. 18, 2000

[54] SEMICONDUCTOR DEVICE WITH A GRADED PASSIVATION LAYER

[75] Inventors: Mark I. Gardner, Cedar Creek; Sey Ping Sun; Daniel Kadosh, both of Austin, all of Tex.

[73] Assignee: Advanced Micro Devices, Inc., Sunnyvale, Calif.

[21] Appl. No.: 09/002,651

[22] Filed: Jan. 5, 1998

[51] Int. Cl.[7] .................................................. H01L 23/48
[52] U.S. Cl. ...................... 257/634; 257/639; 257/649; 257/655
[58] Field of Search ..................................... 257/632, 634, 257/635, 640, 641, 649, 650, 644, 655

[56] References Cited

U.S. PATENT DOCUMENTS

| 4,476,621 | 10/1984 | Bopp et al. | 257/644 |
|---|---|---|---|
| 5,003,062 | 3/1991 | Yen | 257/760 |
| 5,057,897 | 10/1991 | Nariani et al. | 257/760 |
| 5,479,054 | 12/1995 | Tottori | 257/752 |
| 5,598,028 | 1/1997 | Losavio et al. | 257/758 |
| 5,716,890 | 2/1998 | Yap | 257/644 |

*Primary Examiner*—David Hardy

[57] ABSTRACT

The formation of a graded passivation layer is disclosed. In one embodiment, a method includes four steps. In the first step, at least one transistor on a semiconductor substrate is provided. In the second step, at least one metallization layer is formed over the at least one transistor. In the third step, an oxide layer is deposited over the at least one metallization layer. Finally, in the fourth step, an ion implantation of a predetermined dopant is applied to create a graded passivation film over the at least one metallization layer.

15 Claims, 2 Drawing Sheets

SEMICONDUCTOR DEVICE WITH A GRADED PASSIVATION LAYER

FIELD OF THE INVENTION

The present invention relates generally to integrated circuit manufacturing and more particularly to the formation of a graded passivation layer.

BACKGROUND OF THE INVENTION

An insulated-gated field-effect transistor (IGFET), such as a metal-oxide semiconductor field-effect transistor (MOSFET), uses a gate to control an underlying surface channel joining a source and a drain. The channel, source and drain are located within a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

The functioning of IGFETs can be altered by various contaminants. Primary among them are chemicals such as sodium and chlorine. Additionally, other chemicals can attack the layers of IGFETs, and environmental factors, such as particulates, humidity, and static can ruin IGFETs or change their performance. Other concerns are the influence of light and radiation impinging on the surface of an IGFET. Some IGFETs may be extremely light or radiation sensitive. This factor is considered in the selection of packaging materials and processing of the IGFETs. A dominant IGFET characteristic is the extreme vulnerability of its surface to physical abuse. The surface components of a particular integrated circuit containing many IGFETS, for example, are only a small distance down into the wafer surface.

These environmental and physical concerns are typically addressed via the deposition of a passivation layer near the end of the fabrication process. This layer is known by several different names, such as silox, vapox, pyrox, glassivation layer, PSG, BSG, and PBSG. Two materials commonly used for the passivation layer are silicon dioxide and silicon nitride. Thus, the passivation layer is a sealing layer added at the end of the fabrication process to prevent or retard deterioration of electronic properties through chemical action, corrosion, or handling during the packaging processes, and thus protects against moisture and contamination.

Passivation layers such as silicon dioxide and silicon nitride, however, do not prevent all such deterioration, nor do they completely protect against all moisture and contamination. There is a need, therefore, for better, more preventative and more protective passivation layers.

SUMMARY OF THE INVENTION

The above-mentioned shortcomings, disadvantages and problems are addressed by the present invention, which will be understood by reading and studying the following specification. The invention relates to the formation of a graded passivation layer. In one embodiment, a method includes four steps. In the first step, at least one transistor on a semiconductor substrate is provided. In the second step, at least one metallization layer is formed over the at least one transistor. In the third step, an oxide layer is deposited over the at least one metallization layer. Finally, in the fourth step, an ion implantation of a predetermined dopant is applied to create a graded passivation film over the at least one metallization layer. The graded passivation film thus includes the oxide layer as doped with the predetermined dopant.

The graded passivation film provided by the invention is believed to provide for better prevention and protection qualities than prior art passivation films. The present invention describes methods, devices, and computerized systems of varying scope. In addition to the aspects and advantages of the present invention described here, further aspects and advantages of the invention will become apparent by reference to the drawings and by reading the detailed description that follows.

DETAILED DESCRIPTION OF THE INVENTION

In the following detailed description of exemplary embodiments of the invention, reference is made to the accompanying drawings which form a part hereof, and in which is shown by way of illustration specific exemplary embodiments in which the invention may be practiced. These embodiments are described in sufficient detail to enable those skilled in the art to practice the invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the appended claims.

Figure 1A:
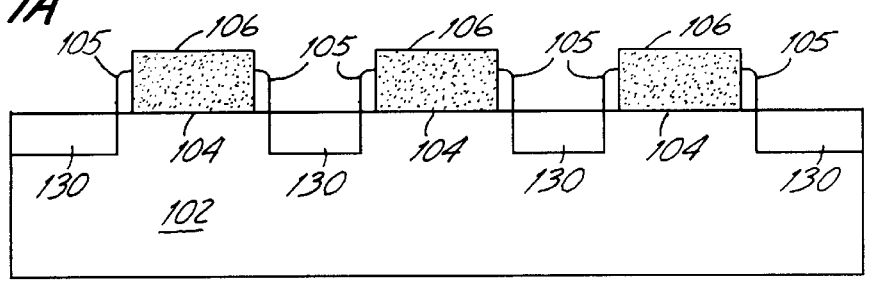
FIGS. 1A–1C show cross-sectional views of successive process steps for making an IGFET in accordance with one embodiment of the invention; and, FIG. 2 is a diagram of a computerized system, in accordance with which the invention may be implemented.

Described first is an IGFET known as a MOS. In FIG. 1A, a typical IGFET is shown. The construction of such an IGFET is now summarized, as known by those of ordinary skill within the art. Silicon substrate 102 suitable for integrated circuit manufacture includes P-type epitaxial layer with a boron background concentration. Desirably, the epitaxial surface layer is disposed on a P+ base layer, not shown, and includes a planar top surface. Gate oxide 104, comprise of silicon dioxide, is formed on the top surface of substrate 102 using oxide tube growth. Thereafter, a blanket layer of undoped polysilicon 106 is deposited by low pressure chemical vapor deposition (LPCVD) on the top surface of gate oxide 104. If also desired, polysilicon 106 can be doped in situ as deposition occurs, or doped before a subsequent etch step by implanting arsenic.

The polysilicon 106 deposited on the substrate 102 is implanted with arsenic ions and then with nitrogen ions. The arsenic ions enhance the rate of silicon dioxide growth in subsequent oxidation processes used to add or grow an additional layer of silicon dioxide. Doping with nitrogen is optional. The nitrogen ions may be added to retard the diffusion of the arsenic atoms. Photoresist (not shown in FIG. 1A) is deposited as a continuous layer on polysilicon 106 and selectively irradiated. Thereafter, the photoresist is developed and the irradiated portions of the photoresist are removed to provide openings in photoresist. The openings expose portions of polysilicon 106, thereby defining gates.

An anisotropic etch is applied that removes the exposed portions of polysilicon 106. Desirably, a first dry etch is applied that is highly selective of polysilicon, and a second dry etch is applied that is highly selective of silicon dioxide, using photoresist 110 as an etch mask. After etching occurs, the remaining portions of polysilicon 106 provides polysilicon gates with opposing vertical sidewalls (or, edges). The photoresist is stripped, and spacers 105 are formed adjacent to the sidewalls of the gates. Spacers 105 are typically nitride. Finally, source and drain regions 130 and are formed by an ion implantation. Source and drain regions 130 are heavily doped regions. The ion implantation may be an n-type dopant, such as arsenic, if an NMOSFET is desired, or a p-type dopant, such as boron, if a PMOSFET is desired.

Those of ordinary skill within the art will recognize that the IGFET of FIG. 1A is representative, and the invention is not limited to the IGFET of FIG. 1A. Other IGFETs are also amenable to the invention, an embodiment of which is now further described in reference to FIG. 1B and FIG. 1C.

Figure 1B:
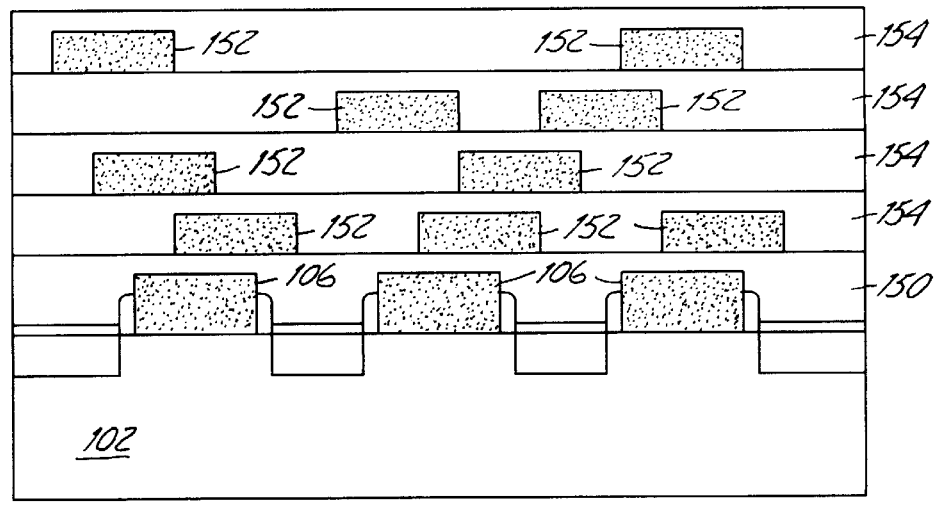

Referring to FIG. 1B, an oxide protective layer is deposited over the transistors formed in FIG. 1B, and thereafter metallization layers including metal 152 deposited within dielectric 154 are formed. As shown in FIG. 1B, there are four metallization layers. However, the invention is not so limited. Typically, there are between three to ten such layers. Common metals 152 include aluminum, aluminum-silicon alloys, aluminum-copper alloys, barrier metals, refractory metals and refractory metal silicides, doped poly silicon, metal film stacks, multilevel metal schemes, and copper. Typical techniques to deposit the metallization layers include vacuum evaporation, sputter deposition, and chemical vapor deposition (CVD) metallization.

Figure 1C:
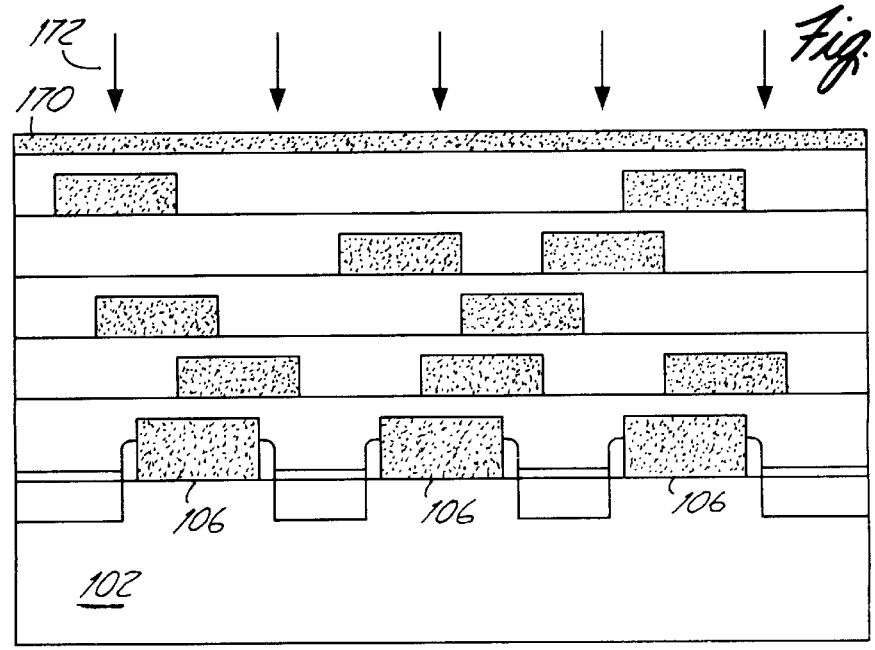

Referring finally to FIG. 1C, a graded passivation film 170 is formed over the metallization layers. The graded passivation film 170 is desirably formed by first depositing an oxide layer over the metallization layers. Next, an ion implantation is applied, as represented by arrows 172. The ion implantation dopes the oxide layer with a predetermined dopant, such as nitride or oxygen, and is desirably performed between 200 keV and 2,000 keV. The dopant also desirably has a Gaussian distribution profile through the oxide layer, which provides the film with its graded quality in one embodiment of the invention. The invention is not limited to a particular thickness of the resulting graded passivation film 170. However, in one embodiment, the film has a thickness of between 5,000 and 25,000 angstroms. The inventive graded passivation film has high integrity, and is believed to provide better protective and preventative characteristics than prior art passivation films.

Figure 2:
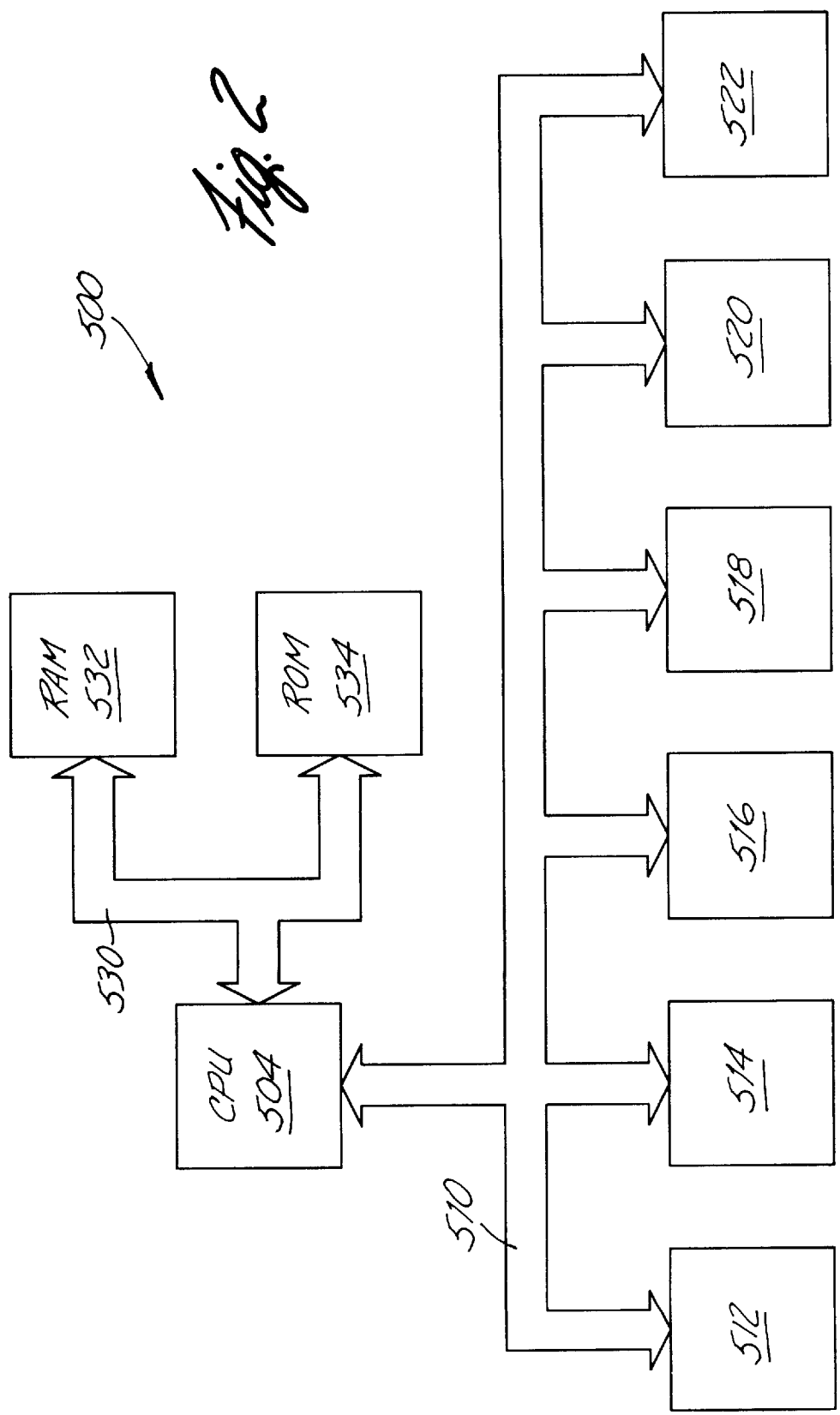

Referring next to FIG. 2, advantageously the invention is well-suited for use in a device such as an integrated circuit chip, as well as an electronic system including a central processing unit, a memory and a system bus. The electronic system may be a computerized system 500 as shown in FIG. 3. The system 500 includes a central processing unit 500, a random access memory 532, and a system bus 530 for communicatively coupling the central processing unit 504 and the random access memory 532. The system 500 includes a device formed by the steps shown in and described in conjunction with FIGS. 1A–1G. The system 500 may also include an input/output bus 510 and several peripheral devices, such as devices 512, 514, 516, 518, 520 and 522, which may be attached to the input/output bus 510. Peripheral devices may include hard disk drives, floppy disk drives, monitors, keyboards, and other such peripherals.

Formation of a graded passivation layer has been described. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the following claims and equivalents thereof.

We claim:

1. A device comprising:
   at least one transistor on a semiconductor substrate;
   at least one metallization layer over the at least one transistor;
   a graded passivation film including an oxide layer doped with a predetermined dopant over the at least one metallization layer, wherein the predetermined dopant is one of nitrogen and oxygen and has a distribution profile through the oxide layer.

2. A device comprising:
   at least one transistor on a semiconductor substrate;
   at least one metallization layer over the at least one transistor;
   a graded passivation film including an oxide layer doped with a predetermined dopant over the at least one metallization layer, wherein the predetermined dopant has a distribution profile through the oxide layer, and the at least one metallization layer comprises from three to ten layers.

3. A device comprising:
   at least one transistor on a semiconductor substrate;
   at least one metallization layer over the at least one transistor;
   a graded passivation film including an oxide layer doped with a predetermined dopant over the at least one metallization layer, wherein the predetermined dopant has a Guassian distribution profile through the oxide layer.

4. A device comprising:
   at least one transistor on a semiconductor substrate:
   at least one metallization layer over the at least one transistor; and
   a graded passivation film including an oxide layer doped with a predetermined dopant over the at least one metallization layer, wherein the graded passivation film has a thickness of between five-thousand and twenty-five thousand angstroms.

5. A computerized system comprising at least one device, each device comprising:
   at least one transistor on a semiconductor substrate;
   at least one metallization layer over the at least one transistor;
   a graded passivation film including an oxide layer doped with a predetermined dopant over the at least one metallization layer, wherein the predetermined dopant within each device is one of nitrogen and oxygen and has a distribution profile through the oxide layer.

6. The system of claim 5, wherein the predetermined dopant within each device is one of nitrogen or oxygen.

7. The system of claim 5, wherein the oxide layer within each device is doped with the predetermined dopant via an ion implantation performed at between 200 keV and 2,000 keV.

8. A computerized system comprising at least one device, each device comprising:
   at least one transistor on a semiconductor substrate;

at least one metallization layer over the at least one transistor;

a graded passivation film including an oxide layer doped with a predetermined dopant over the at least one metallization layer, wherein the predetermined dopant within each device has a Gaussian distribution profile through the oxide layer.

9. A computerized system comprising at least one device, each device comprising:

at least one transistor on a semiconductor substrate;

at least one metallization layer over the at least one transistor;

at graded passivation film including an oxide layer doped with a predetermined dopant over the at least one metallization layer, wherein the graded passivation film within each device has a thickness of between five-thousand and twenty-five-thousand angstroms.

10. A device comprising:

at least one transistor on a semiconductor substrate;

at least one metallization layer over the at least one transistor;

a graded passivation film including an oxide layer doped with a predetermined dopant over the at least one metallization layer, wherein the predetermined dopant has a distribution profile through the oxide layer, wherein the graded passivation film has thickness of between five-thousand and twenty-five thousand angstroms.

11. The device according to claim 10 wherein the predetermined dopant is one of:

nitrogen or oxygen.

12. The device according to claim 11 wherein the oxide layer is doped with the predetermined dopant via an ion implantation, said ion implantation being performed at between 200 keV and 2000 keV.

13. A computerized system comprising at least one device, each device comprising:

at least one transistor on a semiconductor substrate;

at least one metallization layer over the at least one transistor;

a graded passivation film including an oxide layer doped with a predetermined dopant over the at least one metallization layer, wherein the predetermined dopant within each device has a distribution profile through the oxide layer, wherein the graded passivation film has a thickness of between five-thousand and twenty-five thousand angstroms.

14. The system according to claim 13 wherein the predetermined dopant is one of:

nitrogen or oxygen.

15. The system according to claim 14 wherein the oxide layer is doped with the predetermined dopant via an ion implantation, said ion implantation being performed at between 200 keV and 2000 keV.

* * * * *